United States Patent [19]
Penman et al.

[11] Patent Number: 5,191,297
[45] Date of Patent: Mar. 2, 1993

[54] TRANSCONDUCTANCE AMPLIFIER HAVING SENSFETS WHICH DRIVE A LOAD WITH LINEARLY PROPORTIONAL CURRENT

[75] Inventors: Richard Penman, N. Ogden; Sean Varley, Salt Lake City, both of Utah

[73] Assignee: Iomega Corporation, Roy, Utah

[21] Appl. No.: 735,646

[22] Filed: Jul. 25, 1991

[51] Int. Cl.$^5$ ............................................. H03F 1/34
[52] U.S. Cl. ................................. 330/146; 330/277; 330/293; 360/78.12
[58] Field of Search ...................... 330/146, 277, 293; 318/678, 679, 681; 360/78.12, 78.13

[56] References Cited

U.S. PATENT DOCUMENTS

| | | | |
|---|---|---|---|
| 4,439,800 | 3/1984 | Powell | 360/78 |
| 4,620,252 | 10/1986 | Bauck et al. | 360/106 |
| 4,885,517 | 12/1989 | Pennock | 318/681 X |
| 4,905,151 | 2/1990 | Weiman | 364/424.02 |
| 4,962,453 | 10/1990 | Pong | 364/424.02 |
| 4,967,862 | 11/1990 | Pong | 180/19.3 |
| 4,992,672 | 2/1991 | Norton | 307/10.1 |
| 5,001,398 | 3/1991 | Dunn | 330/298 X |

OTHER PUBLICATIONS

"Coupled Compensator", *IBM Technical Disclosure Bulletin*, vol. 33, No. 5, Oct. 1990, pp. 363–364.
Power IC Drives Motors from Logic Level PWM, Dec. 1988 pp. 111–113.
Current Sensing Simplifies Motor Control Design, Nov. 10, 1988, pp. 119–126.
Power ICs, Better Packing, More Brains and Brawn, Jun. 23, 1988, pp. 85–88.
Integral Sensing for Simpler Current Limiting, Jun. 23, 1988, pp. 100–105.
Lossless Current Sensing with Sensefets Enhances Motor Drive Design, Apr., 1986, pp. 30–34.

*Primary Examiner*—James B. Mullins
*Attorney, Agent, or Firm*—Woodcock, Washburn, Kurtz, Mackiewicz & Norris

[57] ABSTRACT

A transconductance amplifier has sensfets connected to an H bridge configuration to drive a load with current which is linearly proportional to the input signal. A inverting or a non-inverting side is active depending upon whether the signal is above or below a reference. Three stages include power amplifiers, switches and comparators for turning the two sides on and off. A mirror current source for each sensfet provides feedback to maintain the linearity of the load current as a function of input signal, thus eliminating the need for a resistor in the current path for sensing the feedback.

8 Claims, 6 Drawing Sheets

TRANSCONDUCTANCE AMPLIFIER HAVING SENSFETS WHICH DRIVE A LOAD WITH LINEARLY PROPORTIONAL CURRENT

FIELD OF THE INVENTION

This invention relates to a transconductance amplifier, and more particularly, to an amplifier which drives a load with current which is linearly proportional to the input signal.

BACKGROUND OF THE INVENTION

Amplifiers for supplying current at power levels to a load are extensively used. For example, in magnetic disk drives, the magnetic read/write head is positioned by an actuator driven by a voice coil motor. U.S. Pat. Nos. 4,439,800-Powell and 4,620,252 - Bauck, et al show an actuator for a magnetic disk drive. Such actuators must be driven with power current proportional to an input signal. This is difficult because the voice coil has a high inductance and it is difficult to drive the coil with a high current having a fast rise time. Bipolar power operational amplifiers are typically used to drive these actuators but improvement in input signal tracking is desirable.

Newly developed field effect transistors called sensfets have been used to drive motors and the like. Such devices are described in MACHINE DESIGN, Jun. 23, 1988, pp. 100-105. In addition to the normal source, drain and gate elements of a field effect transistor, the sensfets also have a mirror pin for load current sensing and a Kelvin pin for temperature compensation. The mirror pin current is a small linearly proportional fraction of the track load current between the source and the drain. This provides sensing output which is used to obtain essentially lossless load current sensing. These devices have been extensively used in circuits which turn the current on or off. For example, in pulse width modulation circuits sensfets turn the load current on or off.

SUMMARY OF THE INVENTION

In accordance with the present invention sensfet semiconductor devices are used in a transconductance amplifier which drives a load with current which is proportional to the input signal.

In accordance with the present invention two sensfet devices are connected as an H bridge amplifier. Each sensfet device has a negative feedback circuit connected between the source of sense current and the gate. This negative feedback maintains the current flow through the load linearly proportional to the input voltage.

The transconductance amplifier of the invention includes inverting and non-inverting sides, one of which conducts current through the load when the input signal is positive with respect to a reference voltage and the other of which is conductive when the input signal is negative with respect to the reference voltage. Each side includes three stages. One stage includes a p-channel mosfet serving as a switch and a comparator which renders the appropriate sensfet device conductive in accordance with the polarity of the input signal. The known amplification stage includes the sensfet devices and two bandwidth limited operational amplifiers. This stage controls the amplitude of the load current as determined by the gain of the transconductance amplifier. The third stage includes the two current mirrors which mirror the currents from the sensfets and provide negative feedback to the amplifiers of the power stage.

The amplifier of the present invention has the advantage that the sensing resistor needed to provide negative feedback is not in the load circuit. Because of this, there is very little resistance in the load circuit except for the resistance of the load. This allows the voltage across the load to swing between the limits of the power supply. This is sometimes referred to as swinging close to the voltage supply rails, or as requiring minimum voltage overhead. The load voltage range is increased over that of a conventional amplifier. The amplifier of the present invention also has the advantage that as the load current increases, the bandwidth of the amplifier increases.

The foregoing and other objects, features and advantages of the invention will be better understood from the following more detailed description and appended claims.

SHORT DESCRIPTION OF THE DRAWINGS

DESCRIPTION OF THE PREFERRED EMBODIMENT

Figure 1:
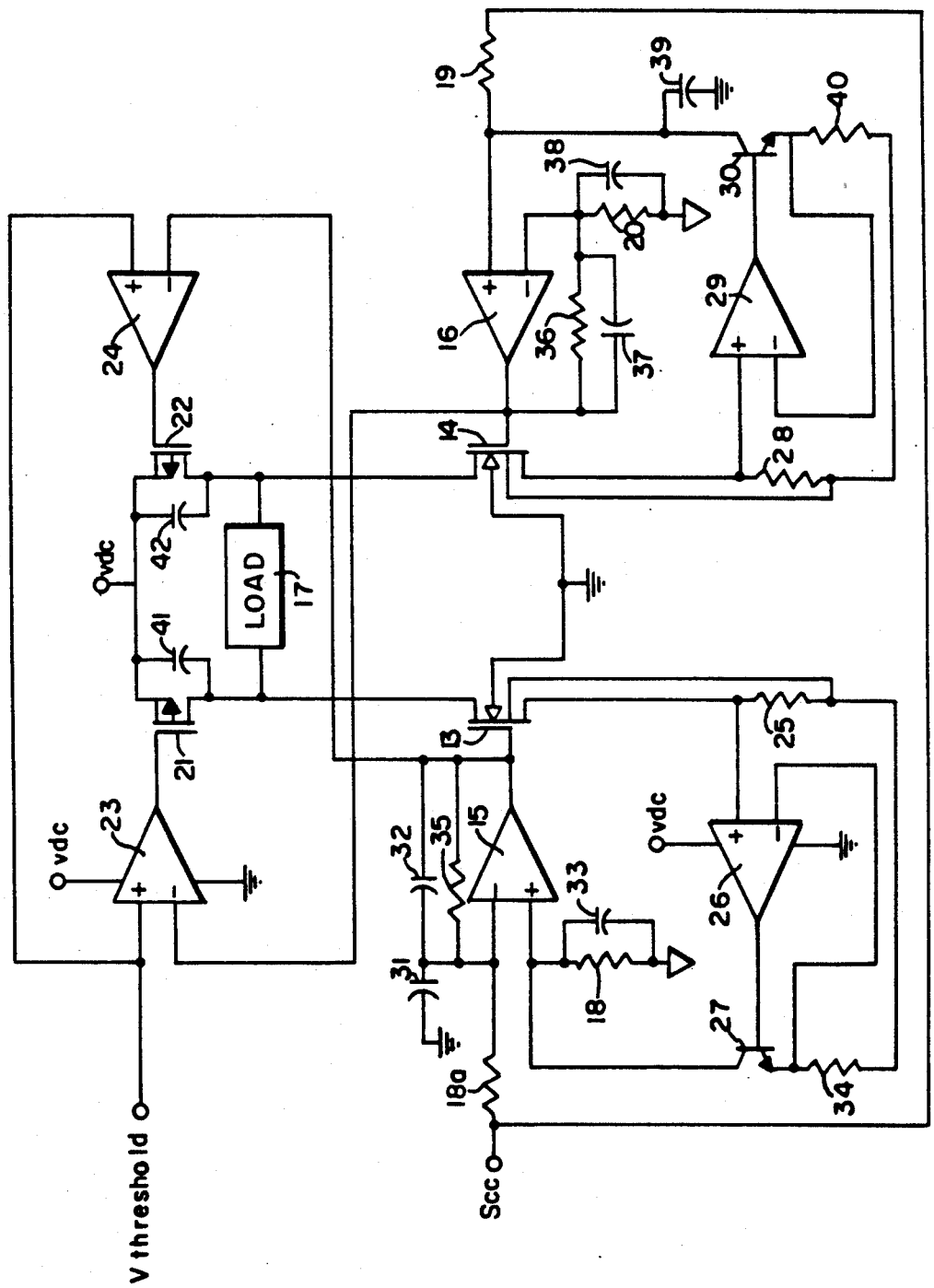
FIG. 1 is a circuit diagram of the transconductance amplifier of the present invention.

The H bridge amplifier shown in FIG. 1 includes an inverting side 11 and a non-inverting side 12. Each side has three stages. The first stage includes n - channel sensfets 13 and 14 and two band width limited operational amplifiers 15 and 16. This stage controls the amplitude of the current through load 17 as determined by the gain of the transconductance amplifier. The gain is set by the value of resistor 18 for the inverting side and the value of resistor 19 for the non-inverting side.

The top stage includes p-channel mosfets 21 and 22 which serve as switches. Two operational amplifiers 23 and 24 serve as comparators. When the output voltage from a power stage operational amplifier exceeds the threshold voltage (V threshold), one of the P-channel fets 21 or 22 is switched on.

The bottom stage includes two current mirrors which mirror sense current from the sensfets and provide negative feedback to the amplifiers of the middle stage. Sense resistor 25 is connected between the mirror and Kelvin pins of sensfet 13. The Kelvin pin isolates the sense current mirror from the load ground, thereby eliminating ground loop errors, or offsets. The sensfet current source in the mirror pin circuit provides negative feedback through operational amplifier 26 and transistor 27 to the non-inverting input of operational amplifier 15.

Similarly, in the non-inverting side, the sense resistor 28 is connected between the mirror pin and the Kelvin pin of sensfet 14. The sense current provides negative feedback through operational amplifier 29 and transistor 30 to the non-inverting input of operational amplifier 16.

The inverting side 11 of the amplifier is active when the input voltage Scc is below the reference voltage Vref. When the input voltage is below Vref, the amplifier 15 output voltage swings high, turning on sensfet 13 and mosfet 22. A fraction of the drain current of sensfet 13 is sensed by the current mirror which includes operational amplifier 26. This is mirrored to the non-inverting input of amplifier 15. As the input voltage drops, the voltage on the non-inverting input of operational amplifier 15 drops providing negative feedback and balancing the amplifier.

The non-inverting side 12 is active when the input voltage Scc is above the reference Vref. When the Scc is above Vref, the output of amplifier 16 swings high turning on the mosfet 21 and the sensfet 14. A fraction of the drain current of sensfet 14 is sensed by the current mirror which includes amplifier 29. This fraction is mirrored to the non-inverting input of operational amplifier 16. As the input voltage increases, the voltage on the non-inverting input of amplifier 16 is regulated providing negative feedback and balancing the amplifier.

Lead-lag compensation stabilizes both sides of the amplifier.

Figure 2:
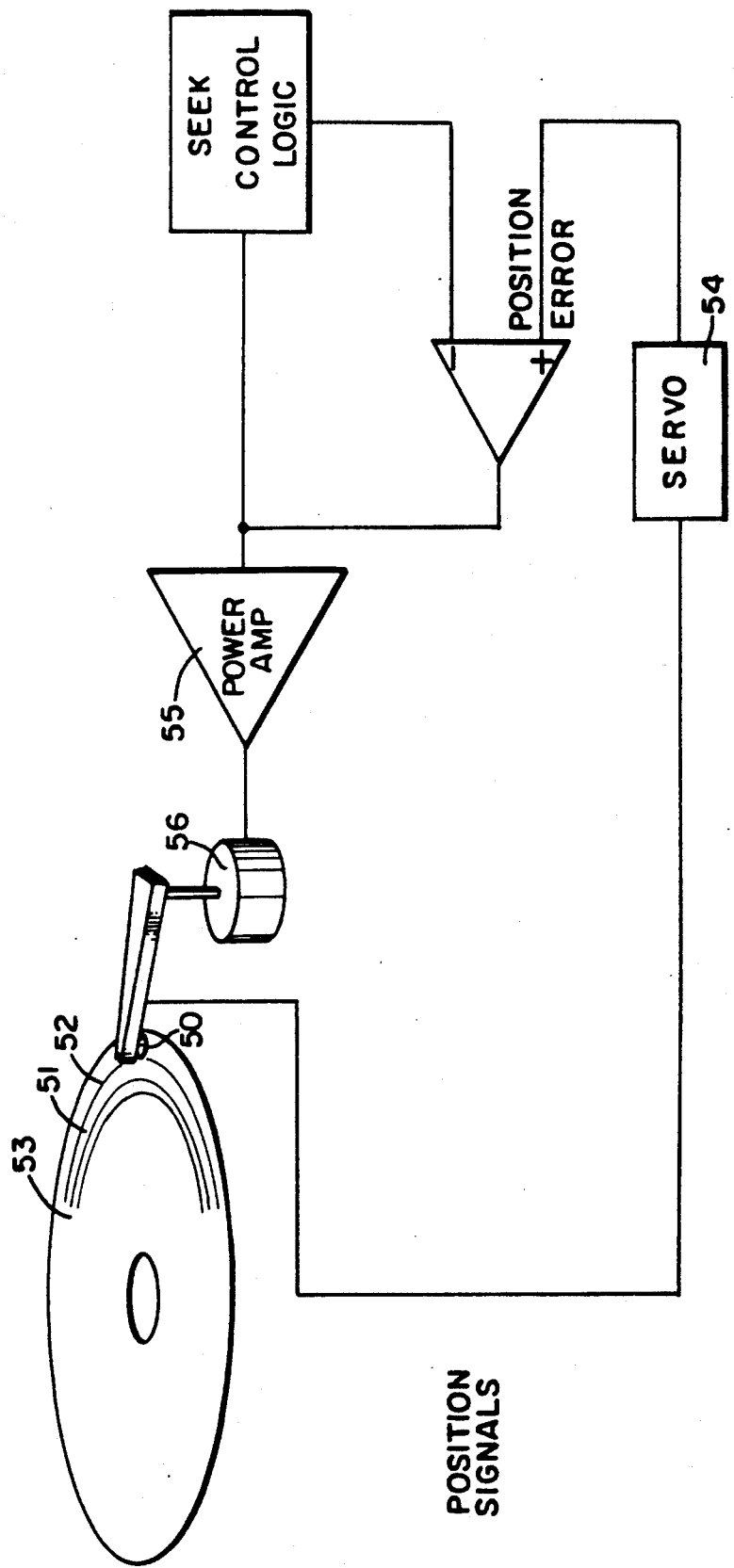
FIG. 2 shows a typical magnetic disk actuator which is advantageously driven by the amplifier of the present invention.

FIG. 2 shows a magnetic disk drive in which a read/write head 50 is moved across the tracks 51, 52 of a magnetic disk 53. A servo system 54 produces a driving signal which is amplified in the power amplifier 55 which drives the actuator 56. The amplifier of the present invention is particularly suitable for driving such an actuator.

One example of a circuit which has been successively used is given below.

| | |
|---|---|
| Sensfet 13 | Motorola Part # MTP 10N10M |
| Sensfet 14 | Motorola Part # MTP 10N10M |
| Operational amplifier 15 | Motorola Part # MC34074D(1) |
| Operational amplifier 16 | Motorola Part # MC34074D(2) |
| Resistor 18a | 10KΩ 5% Ohms |
| Resistor 18 | 1.78KΩ 1% Ohms |
| Resistor 19 | 1.78KΩ 1% Ohms |
| Resistor 20 | 10KΩ 5% Ohms |
| Mosfet 21 | P-channel Fet Motorola #MTP2955 |
| Mosfet 22 | P-channel Fet Motorola #MTP2955 |
| Operational Amplifier 23 | Motorola Part #MC34074D (3) (Quad Amp Package) |
| Operational Amplifier 24 | Motorola Part #MC34074D (4) (Quad Amp Package) |
| Resistor 25 | 49.9 Ω 1% Ohms |
| Operational Amplifier 26 | Linear Tech. Dual Amp. LT1013 |
| Operational Amplifier 29 | Linear Tech. Dual Amp. LT1013 |
| Resistor 28 | 49.9 Ω 1% Ohms |
| Transistor 27 | ZN3904 Bipolar Transistors |
| Transistor 30 | ZN3904 Bipolar Transistors |
| Compacitor 31 | .0001 μF-Microfads |
| Compacitor 32 | .0001 μF-Microfads |
| Compacitor 33 | .0022 μ-Microfads |
| Resistor 34 | 49.9 Ω 1% Ohms |
| Resistor 35 | 1M Ω 5% Ohms |
| Resistor 36 | 2M Ω 5% Ohms |
| Compacitor 37 | .0001 μF-Microfads |
| Compacitor 38 | .0001 μF-Microfads |
| Compacitor 39 | .0022 μF-Microfads |
| Resistor 40 | 49.9 Ω 1% Ohms |
| Compacitor 41 | 1.5 μF |
| Compacitor 42 | 1.5 μF |
| V Threshold | 2.1 V - Volts |
| Vref | 5.6 V - Volts |

The foregoing circuit was used to drive a voice coil motor of an actuator. The coil had a resistance of 2.7Ω and an inductance of 1.3 mH.

Figure 3:
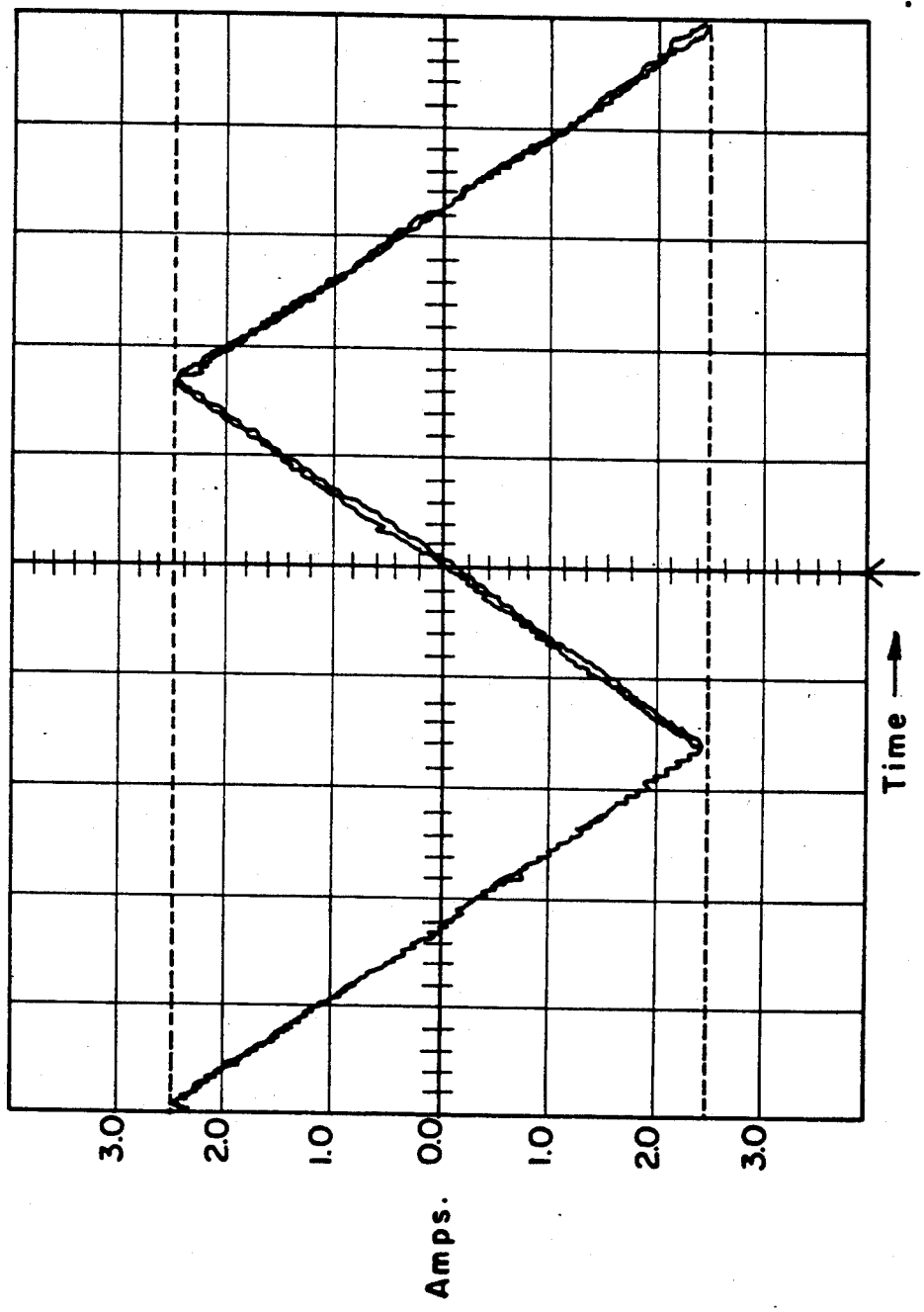
FIG. 3 shows the input signal and load as a function of time for a prior art bipolar power operational amplifier.

FIG. 3 is a graph depicting operation when the foregoing load is driven by a prior art bipolar power operational amplifier. FIG. 3 shows the input voltage Scc as a function of time on channel 1 and the load current on channel 2. Parameters are:

Channel 1 Scc, 1 V$_1$/div.

Channel 2 I$_{RLOAD}$, 1a/div.

T/div=0.5 ms

The load current tracks the input signal, but the maximum current is only 2.5 amps.

Figure 4:
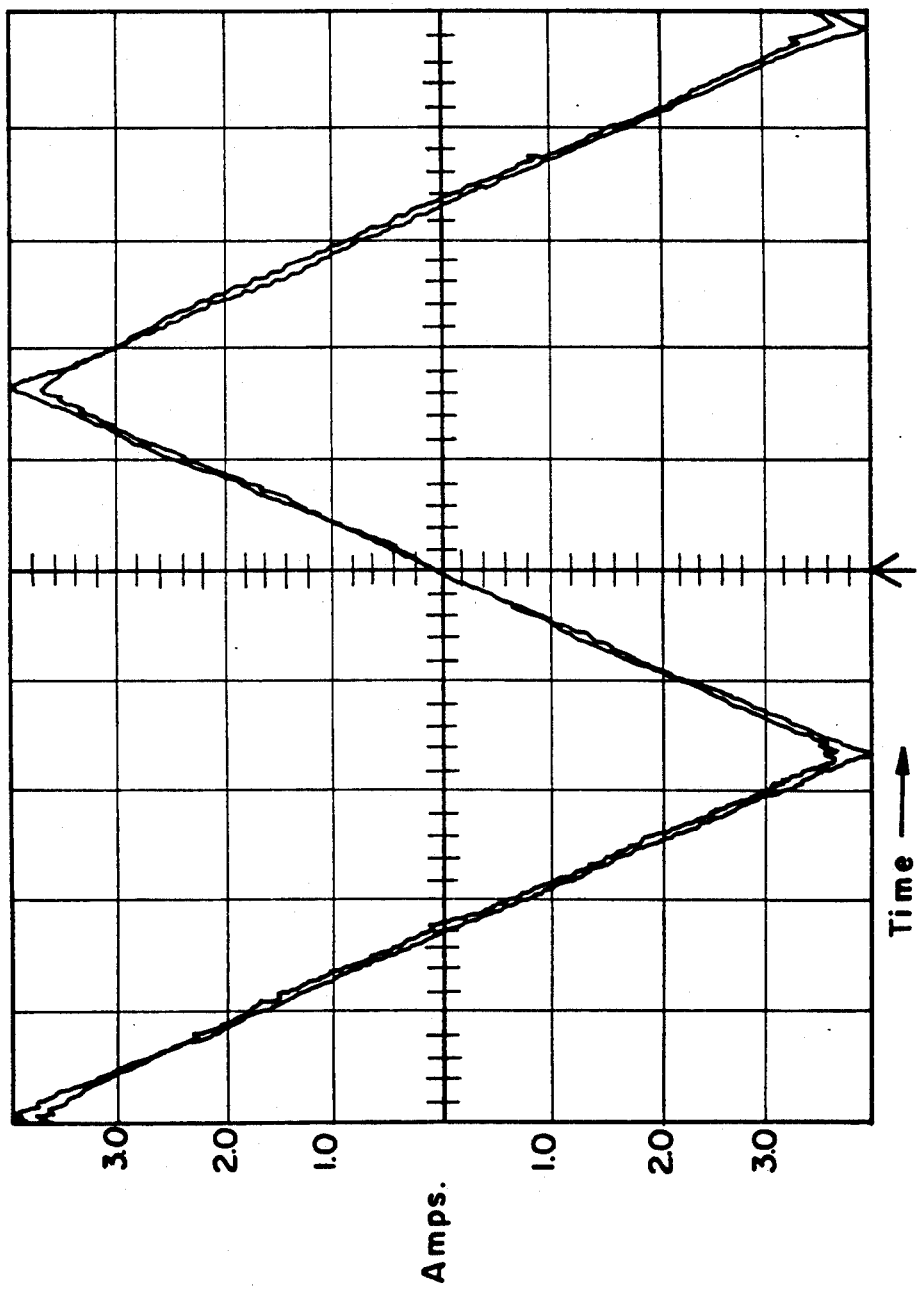
FIG. 4 shows input signal and load current as a function of time for the amplifier of the present invention.

On the other hand, FIG. 4 shows the comparable signals for amplifier or the invention. The input signal is on channel 1 as a function of time and the load current is on channel 2 as a function of time. The parameters are:

Channel 1 Scc, 1 V/div.

Channel 2 I$_{RLOAD}$, 1 A/div.

In the case of the present invention, the maximum current was approximately 4 amps which is close to the limits of the power supply.

Figure 5:
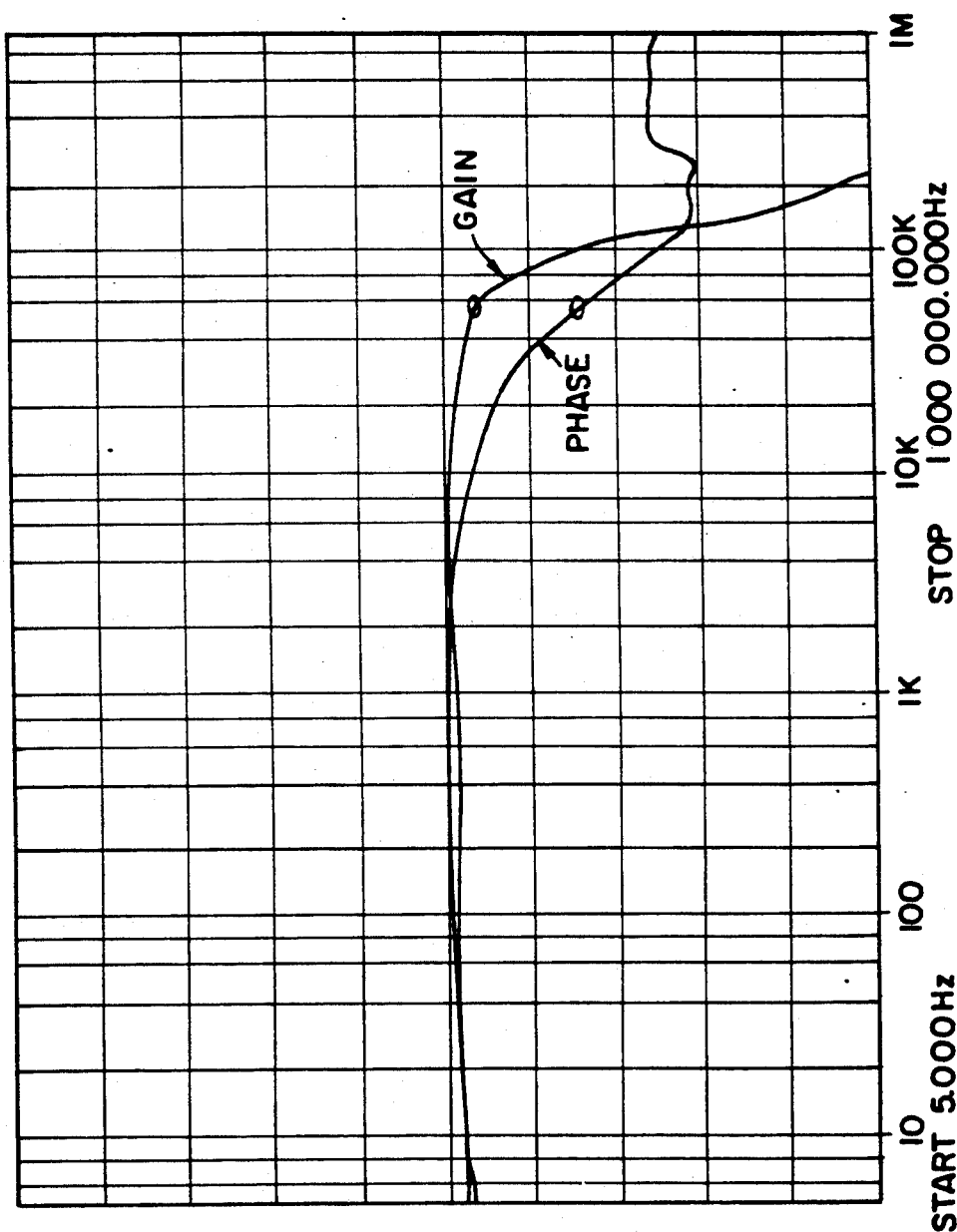
FIG. 5 shows the frequency response of the present invention at an increased load current level illustrating an increase in bandwidth at higher power levels.
Figure 6:
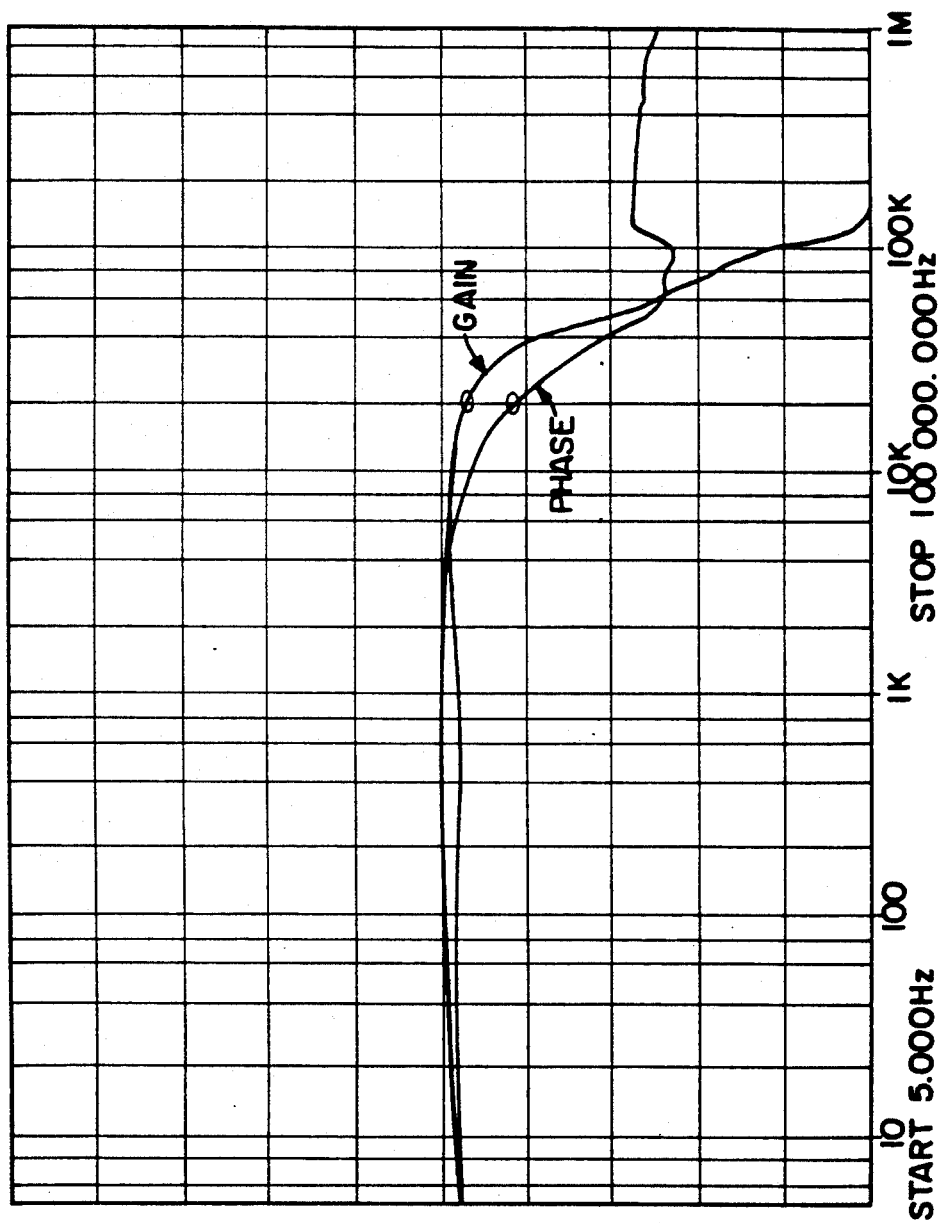
FIG. 6 shows the frequency response of the present invention at a low load current level.

FIG. 5 shows the increase in amplifier bandwidth at an increased power level with respect to FIG. 6. The increase in bandwidth is due to the current mode feedback implemented in the invention. The gain-bandwidth tradeoff inherent in conventional amplifier designs is overcome by this amplifier, therefore slewrate limiting is minimized.

FIGS. 5 and 6 also show the steep gain rolloff at higher frequencies resulting from the poles above the cross-over frequency.

While a particular embodiment of the invention has been shown and described, various modifications may be made. The appended are, therefore, intended to cover all such modifications.

What is claimed is:

1. A transconductance amplifier which drives a load with current which is linearly proportional to an input signal comprising:

two sensfet semiconductor devices, each having a source pin, a drain pin, a gate pin, a mirror pin, and a Kelvin pin, said sensfet devices being of the type in which the current flowing between said source and said drain is controlled by said gate pin, and the current from said mirror pin is a small fraction of the current between said source pin and said drain pin;

a source of power current for each of said sensfet devices, each source of current and said load being connected with said source pins and said drain pins so that said sensfet devices control the flow of current through said load, said sensfet devices being connected as an H bridge amplifier with said load being connected between the drain pins of said sensfet devices;

said input signal being applied to said gate pins;

source means for producing a sense current connected to said mirror pins, said sense current being linearly proportional to said current through said load; and negative feedback means connected between said source of sense current and said gate pins to apply negative feedback to said gate pins to maintain the current flow through said load linearly proportional to said input voltage.

2. The amplifier recited in claim 1 wherein said source means comprises:

two sense resistors, one sense resistor being connected between the mirror pin and the Kelvin pin of each sensfet device so that ground offsets are eliminated.

3. The amplifier recited in claim 1 wherein said source of power current for each of said sensfet devices comprises:

a switching stage including two switches, each being connected between one side of said load and said source of power current, one of said switches being conductive when said input signal is of one polarity and the other of said switches being conductive when said input signal is of the other polarity.

4. The amplifier recited in claim 3 further comprising:

two comparators, said input signal and a threshold voltage being applied to each comparator, one of said comparators turning one of said switches conductive when said input signal exceeds said reference voltage, the other of said comparators turning the other of said switches conductive when said input signal is below said reference voltage.

5. The amplifier recited in claim 4 wherein said negative feedback means includes two negative feedback circuits and two operational amplifiers with one of said operational amplifiers in each of said feedback circuits and wherein said two sensfets devices, two operational amplifiers, two switches, two comparators and two feedback circuits are connected in an inverting side and a non-inverting side, said inverting side supplying power current to said load when said input signal is below said reference voltage and said non-inverting side supplying power current through said load when said input signal is above said reference voltage.

6. The amplifier recited in claim 1 wherein said negative feedback means includes two negative feedback circuits, one for each of said sensfet devices, an operational amplifier in each of said feedback circuits, said input signal being applied to the inverting input of one of said operational amplifiers and to the non-inverting input of the other of said operational amplifiers;

the negative feedback being applied to an input of each operational amplifier to balance said operational amplifiers.

7. The amplifier recited in claim 6 wherein negative feedback is current mode feedback from said source of sense current to said operational amplifier, resulting in reducing slew-rate limiting of said transconductance amplifier.

8. The amplifier recited in claim 1 in a magnetic disk drive in which a read head is driven by an actuator to particular tracks of a magnetic disk, said actuator having a drive coil for moving said magnetic head, said coil being the load which is driven by said amplifier.

* * * * *